(12) United States Patent
Kasuya et al.

(10) Patent No.: US 10,529,772 B2
(45) Date of Patent: Jan. 7, 2020

(54) SEMICONDUCTOR LIGHT DETECTION ELEMENT

(71) Applicant: HAMAMATSU PHOTONICS K.K., Hamamatsu-shi, Shizuoka (JP)

(72) Inventors: Tatsuki Kasuya, Hamamatsu (JP); Takeshi Kawahara, Hamamatsu (JP); Yasuhito Miyazaki, Hamamatsu (JP); Kentaro Maeta, Hamamatsu (JP); Hisanori Suzuki, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 16/081,208

(22) PCT Filed: Mar. 1, 2017

(86) PCT No.: PCT/JP2017/008120
§ 371 (c)(1),
(2) Date: Aug. 30, 2018

(87) PCT Pub. No.: WO2017/150616
PCT Pub. Date: Sep. 8, 2017

(65) Prior Publication Data
US 2019/0035843 A1 Jan. 31, 2019

(30) Foreign Application Priority Data
Mar. 3, 2016 (JP) .................. 2016-041027

(51) Int. Cl.
*H01L 31/0236* (2006.01)
*H01L 27/148* (2006.01)
*H01L 31/0224* (2006.01)

(52) U.S. Cl.
CPC .. *H01L 27/14806* (2013.01); *H01L 31/02366* (2013.01); *H01L 31/022408* (2013.01)

(58) Field of Classification Search
CPC ................... H01L 31/02363; H01L 27/14806
See application file for complete search history.

(56) References Cited

U.S. PATENT DOCUMENTS

| 4,046,594 A * | 9/1977 | Tarui .................. H01L 31/0236 136/244 |
| 4,277,793 A | 7/1981 | Webb |

(Continued)

FOREIGN PATENT DOCUMENTS

| DE | 202011003479 U1 | 5/2011 |
| JP | S64-11556 U | 1/1989 |

(Continued)

OTHER PUBLICATIONS

Hamamatsu Photonics K.K., "Image sensors," Opto-Semiconductor Handbook, Chapter 05, 1-1, Nov. 6, 2013, pp. 107-108, including English translation.

(Continued)

*Primary Examiner* — Mark V Prenty
(74) *Attorney, Agent, or Firm* — Drinker Biddle & Reath LLP

(57) ABSTRACT

A semiconductor photodetector includes a semiconductor substrate including a silicon substrate. The semiconductor substrate includes a second main surface as a light incident surface and a first main surface opposing the second main surface. In the semiconductor substrate, carriers are generated in response to incident light. A plurality of protrusions is formed on the second main surface. The protrusion includes a slope inclined with respect to a thickness direction of the semiconductor substrate. At the protrusion, a (111) surface of the semiconductor substrate is exposed as the slope. The height of the protrusion is equal to or more than 200 nm.

15 Claims, 16 Drawing Sheets

(56) References Cited

U.S. PATENT DOCUMENTS

| | | |
|---|---|---|
| 7,511,750 B2 | 3/2009 | Murakami |
| 2013/0082241 A1 | 4/2013 | Kub et al. |
| 2015/0200216 A1 | 7/2015 | Muramatsu et al. |

FOREIGN PATENT DOCUMENTS

| | | |
|---|---|---|
| JP | H05-190887 A | 7/1993 |
| JP | 2000-106453 A | 4/2000 |
| JP | 2011-222893 A | 11/2011 |
| JP | 2012-216760 A | 11/2012 |
| JP | 2013-33864 A | 2/2013 |
| JP | 2014-220403 A | 11/2014 |
| JP | 2015-50223 A | 3/2015 |
| JP | 2015-520939 A | 7/2015 |
| WO | WO-2013/155011 A1 | 10/2013 |

OTHER PUBLICATIONS

International Preliminary Report on Patentability dated Sep. 13, 2018 for PCT/JP2017/008120.

* cited by examiner

Fig.4
(a)
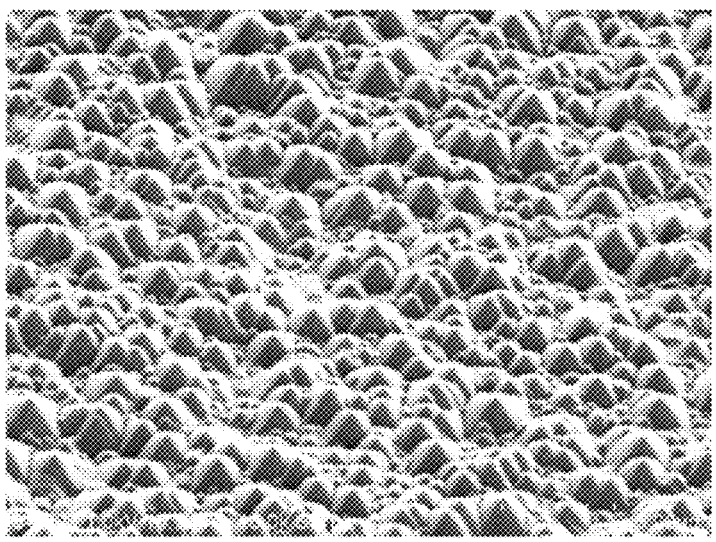
(b)
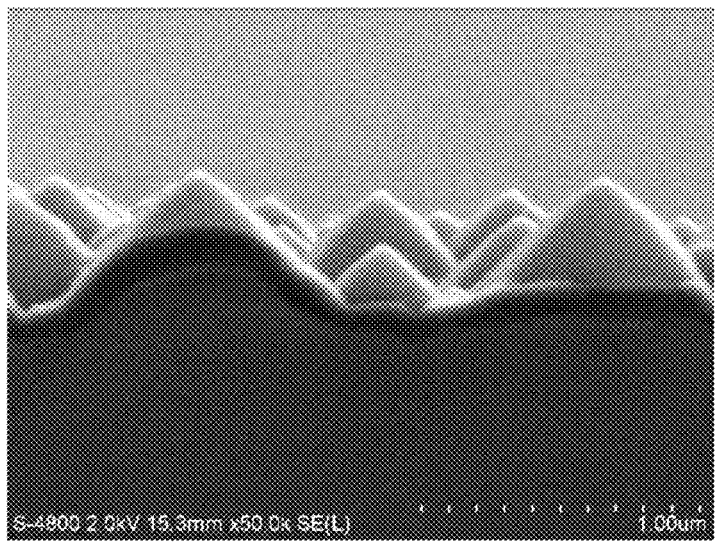

Fig.5
(a) 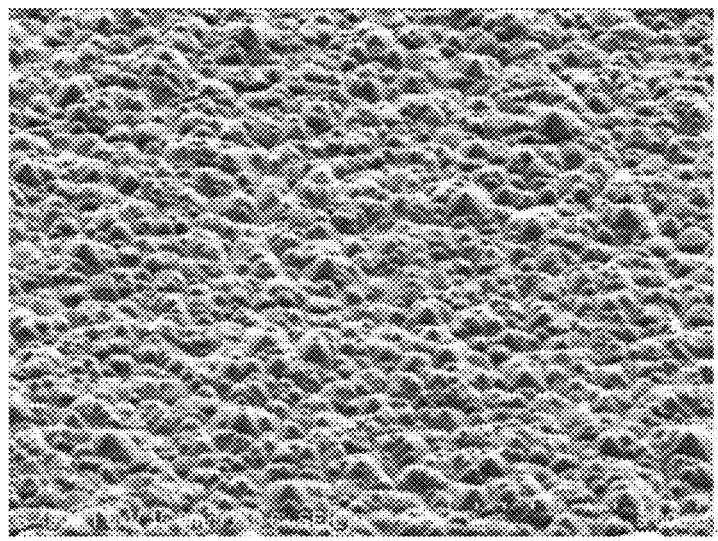
(b) 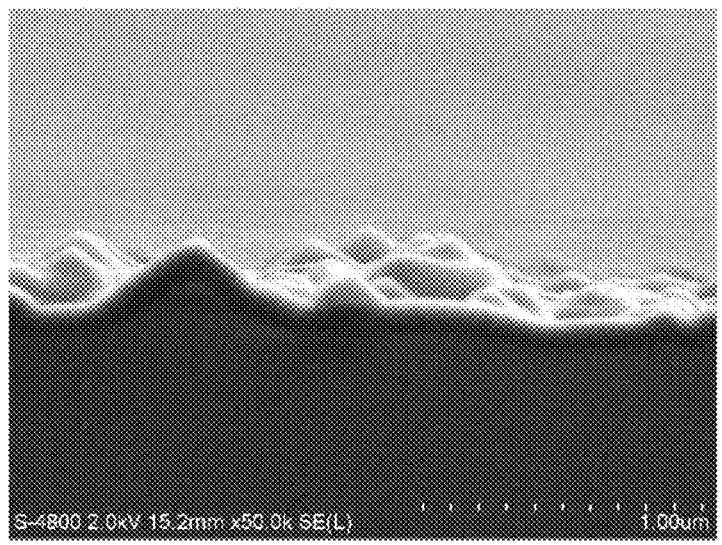

SEMICONDUCTOR LIGHT DETECTION ELEMENT

TECHNICAL FIELD

The present invention relates to a semiconductor photodetector.

BACKGROUND ART

Known semiconductor photodetectors include a silicon substrate including a light incident surface and a back surface opposing the light incident surface and generating carriers in response to the incident light (for example, see Non-Patent Literature 1).

CITATION LIST

Non Patent Literatures

Non Patent Literature 1: Hamamatsu Photonics KK "OPTO-SEMICONDUCTOR HANDBOOK" issued on Nov. 6, 2013 revised edition Chapter 05, 1. CCD image sensors, 1-1 Structure and operating principle p. 107-108

SUMMARY OF INVENTION

Technical Problem

The semiconductor photodetector described in Non Patent Literature 1 has room for enhancement in spectral response in the ultraviolet wavelength band.

An object of one aspect of the present invention is to provide a semiconductor photodetector enhancing spectral response in the ultraviolet wavelength band.

Solution to Problem

One aspect of the present invention is a semiconductor photodetector including a silicon substrate including a light incident surface and a back surface opposing the light incident surface and configured to generate carriers in response to the incident light. A plurality of protrusions including slopes inclined with respect to a thickness direction of the silicon substrate is formed on the light incident surface. At the protrusion, a (111) surface of the silicon substrate is exposed as the slope. A height of the protrusion is equal to or more than 200 nm.

In the semiconductor photodetector according to the one aspect of the present invention, the plurality of protrusions formed on the light incident surface include the slopes inclined with respect to the thickness direction of the silicon substrate. When light is incident on the silicon substrate from the light incident surface, light is partially reflected on the light incident surface side of the semiconductor photodetector. The slope is inclined with respect to the thickness direction of the silicon substrate. Therefore, for example, the light reflected on the slope side of one protrusion is directed to the slope side of a protrusion adjacent to the one protrusion, and is incident on the silicon substrate from the slope of the adjacent protrusion.

Since the (111) surface of the silicon substrate is exposed as the slope at the protrusion, light incident on the silicon substrate from the slope tends to be taken into the silicon substrate. Since the height of the protrusion is equal to or more than 200 nm, the surface area of the slope is large. Therefore, a large amount of light incident on the slope is taken into the silicon substrate.

Light in the ultraviolet wavelength region is absorbed in a region close to the light incident surface of the silicon substrate because of its large absorption coefficient by silicon. Since the (111) surface of the silicon substrate is exposed at the protrusions formed on the silicon substrate in the semiconductor photodetector according to the one aspect, absorption of light in a region close to the light incident surface is not inhibited.

From the above reasons, the semiconductor photodetector according to the one aspect enhances spectral response in the ultraviolet wavelength band.

A semiconductor region having a conductivity type different from a conductivity type of the silicon substrate may be provided on the back surface side of the silicon substrate, and an accumulation layer may be provided on the light incident surface side of the silicon substrate. In this case, the slope of the protrusion is included in a surface of the accumulation layer. The present embodiment achieves a back-illuminated semiconductor photodetector having enhanced spectral response in the ultraviolet wavelength band. The accumulation layer recombines unnecessary carriers generated irrespective of light on the light incident surface side, and reduces the dark current. The accumulation layer suppresses carriers generated by light near the light incident surface of the silicon substrate from being trapped on the light incident surface. Therefore, the carriers generated by light efficiently migrate to pn junction formed by the silicon substrate and the semiconductor region. Consequently, according to the present embodiment, the photodetection sensitivity is enhanced.

A semiconductor region having a conductivity type different from a conductivity type of the silicon substrate may be provided on the light incident surface side of the silicon substrate. In this case, a front-illuminated semiconductor photodetector having enhanced spectral response in the ultraviolet wavelength band is achieved.

A semiconductor photodetector according to the one aspect may further include an oxide film disposed on the light incident surface and configured to transmit incident light, and may include an electrode film disposed on the oxide film and configured to transmit incident light and be connected to a predetermined potential. The ultraviolet light incident on the oxide film might lead to an occurrence of a phenomenon (charge-up phenomenon) in which the oxide film is charged. The occurrence of the charge-up phenomenon degrades the spectral response in the ultraviolet wavelength band. In the present embodiment, since the electrode film connected to a predetermined potential is disposed on the oxide film, charging of the oxide film is suppressed. Therefore, the present embodiment suppresses degradation of the spectral response in the ultraviolet wavelength band.

The electrode film may include a film made of graphene. In this case, the decrease in transmission characteristics in the ultraviolet wavelength band is suppressed. Consequently, the decrease in the spectral response in the ultraviolet wavelength band due to the electrode film is suppressed.

The oxide film may be a silicon oxide film. In this case, the oxide film functions as an anti-reflection film. Therefore, light tends to be further taken in by the silicon substrate, and the spectral response in the ultraviolet wavelength band is further enhanced.

The oxide film may be an aluminum oxide film. In this case, a fixed charge of a predetermined polarity exists on the light incident surface side of the silicon substrate due to the aluminum oxide film. A region on the light incident surface side of the silicon substrate where the fixed charge of a predetermined polarity exists functions as an accumulation layer.

A semiconductor photodetector according to the one aspect may include a film disposed on the light incident surface, configured to transmit the incident light, and containing boron. In this case, the semiconductor photodetector suppresses the degradation of the spectral response in the ultraviolet wavelength band.

Advantageous Effects of Invention

According to the one aspect of the present invention, it is possible to provide a semiconductor photodetector enhancing spectral response in the ultraviolet wavelength band.

BRIEF DESCRIPTION OF DRAWINGS

FIG. 4 is a SEM image obtained by observation of a semiconductor photodetector according to Example 1.

FIG. 5 is a SEM image obtained by observation of a semiconductor photodetector according to Example 2.

DESCRIPTION OF EMBODIMENTS

Figure 1:
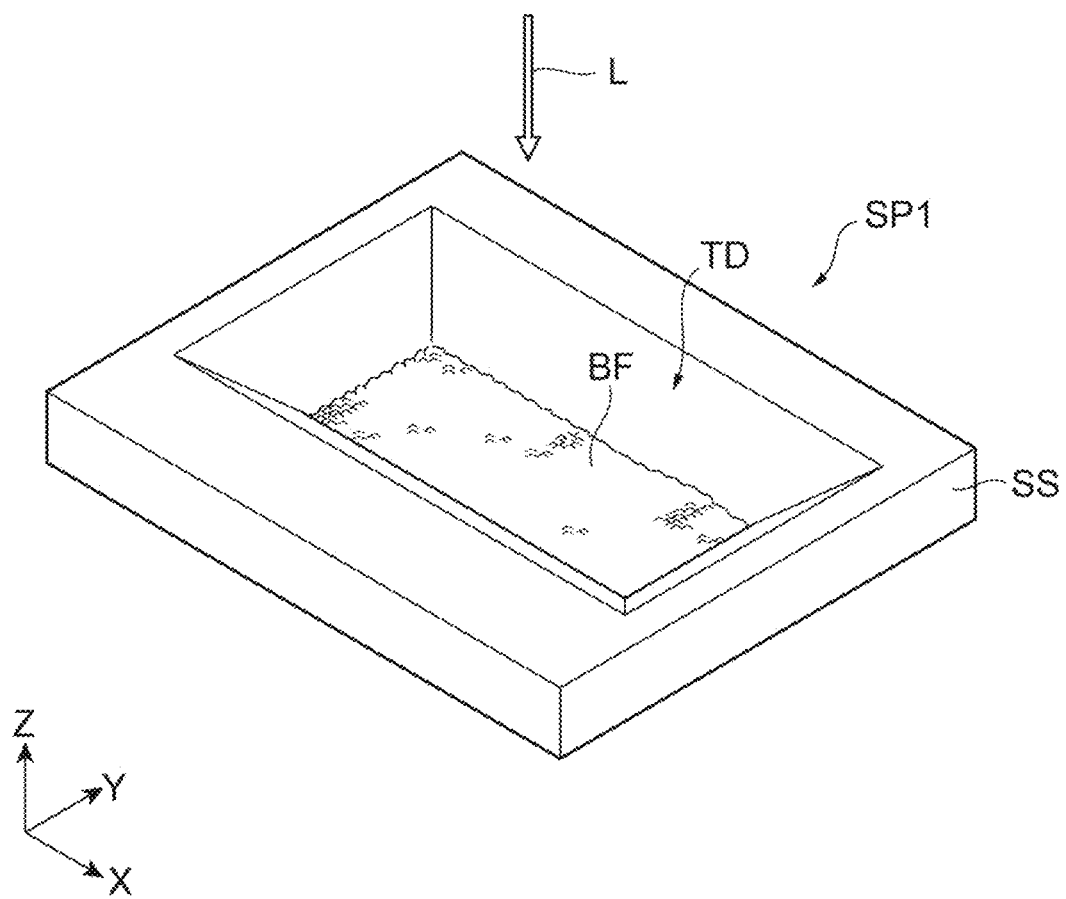
FIG. 1 is a perspective view illustrating a semiconductor photodetector according to a first embodiment.

Embodiments of the present invention will be described in detail with reference to the accompanying drawings. In the description, the same reference numerals are used for the same elements or elements having the same function, and redundant explanations will be omitted.

First Embodiment

Figure 2:
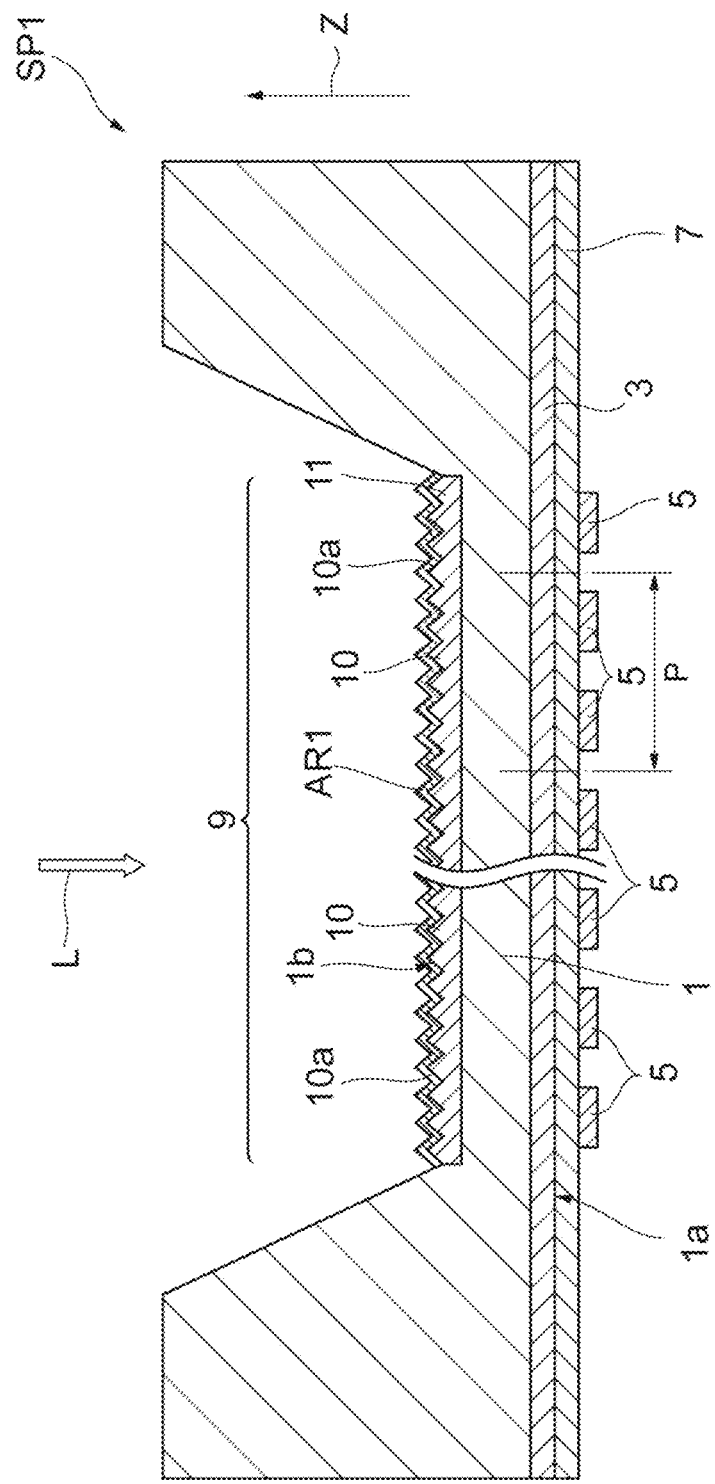
FIG. 2 is a diagram illustrating a cross-sectional configuration of the semiconductor photodetector according to the first embodiment.

A configuration of a semiconductor photodetector SP1 according to a first embodiment will be described with reference to FIGS. 1 and 2. FIG. 1 is a perspective view illustrating the semiconductor photodetector according to a first embodiment. FIG. 2 is a diagram illustrating a cross-sectional configuration of the semiconductor photodetector according to the first embodiment.

As illustrated in FIG. 1, the semiconductor photodetector SP1 is a back-illuminated solid-state imaging element. The semiconductor photodetector SP1 is a BT-CCD (charge coupled device) in which the backside of a semiconductor substrate SS is thinned. The thinning of the semiconductor substrate SS is implemented by etching, for example. As an etching solution, for example, potassium hydroxide solution or TMAH (tetramethylammonium hydroxide solution) is used.

A recess TD is formed in a central region of the thinned semiconductor substrate SS. A thick frame portion exists around the recess TD. The side surface of the recess TD is inclined at an obtuse angle with respect to a bottom surface BF. The thinned central region of the semiconductor substrate SS is a photosensitive region (imaging region). Light L is incident on the photosensitive region, for example, along the negative direction of the Z axis. The bottom surface BF of the recess TD of the semiconductor substrate SS constitutes a light incident surface. The frame portion may be removed by etching. In this case, a back-illuminated solid-state imaging element in which the entire region is thinned is obtained.

As illustrated in FIG. 2, the semiconductor photodetector SP1 includes a p-type (first conductivity type) semiconductor substrate 1 as the semiconductor substrate SS. The semiconductor substrate 1 is made of silicon (Si) crystal, and includes a first main surface $1a$ and a second main surface $1b$ opposing each other. The semiconductor substrate 1 is a silicon substrate having a surface orientation (100). In the semiconductor substrate 1, carriers are generated in response to incident light. The second main surface $1b$ is a light incident surface, and the first main surface $1a$ is a back surface of the light incident surface. The thickness direction of the semiconductor substrate 1 is a direction parallel to the Z axis. The thickness of the central region of the semiconductor substrate 1 is 5 to 30 μm, for example.

The thickness of the semiconductor substrate 1 is set to be equal to or less than a pixel pitch P. In the present embodiment, the pixel pitch P is 5 to 48 μm, for example. The thickness of the semiconductor substrate 1 is 5 to 30 μm, for example. The present embodiment illustrates a solid-state imaging element driven by two-phase clock as the semiconductor photodetector SP1. Under individual transfer electrodes, regions (not illustrated) with mutually different impurity concentrations exist to reliably transfer the charges in one direction.

In the use of Si, a Group III element such as B is used as a p-type impurity and a Group V element such as N, P, or As is used as an n-type impurity. Even when an n-type and a p-type as conductivity types of semiconductors are interchanged in forming an element, it is possible to function the element.

On the first main surface $1a$ side of the semiconductor substrate 1, an n-type semiconductor layer (semiconductor region) 3 as a charge transfer portion is provided. A pn junction is formed between the semiconductor substrate 1 and the semiconductor layer 3. A plurality of charge transfer electrodes 5 as transfer electrode portions is disposed on the first main surface 1a of the semiconductor substrate 1, via an insulating layer 7. An isolation region (not illustrated) for electrically separating the semiconductor layer 3 for each of vertical CCDs is formed on the first main surface 1a side of the semiconductor substrate 1. The thickness of the semiconductor layer 3 is 0.1 to 1 µm, for example.

A plurality of protrusions 10 is formed on the second main surface 1b of the semiconductor substrate 1. In the present embodiment, the plurality of protrusions 10 is formed over the entire region corresponding to the photosensitive region 9 on the second main surface 1b. Each of the protrusions 10 has a substantially conical shape and includes a slope 10a inclined with respect to the thickness direction of the semiconductor substrate 1. The protrusion 10 has a substantially quadrangular pyramid shape, for example. The height of the protrusion 10 is equal to or more than 200 nm. The interval between the apexes of two adjacent protrusions 10 is 500 to 3000 nm, for example.

In the protrusion 10, the (111) surface of the semiconductor substrate 1 is exposed as the slope 10a. The slope 10a is optically exposed. The state that the slope 10a is optically exposed includes not merely a case where the slope 10a is in contact with atmospheric gas such as air but also a case where an optically transparent film is formed on the slope 10a.

In the semiconductor photodetector SP1, an accumulation layer 11 is provided on the second main surface 1b side of the semiconductor substrate 1. The slope 10a of the protrusion 10 is included in the surface of the accumulation layer 11. The accumulation layer 11 has the same conductivity type (p-type) as that of the semiconductor substrate 1. The impurity concentration of the accumulation layer 11 is higher than the impurity concentration of the semiconductor substrate 1.

In the present embodiment, the accumulation layer 11 is formed by ion-implanting or diffusing p-type impurities from the second main surface 1b side within the semiconductor substrate 1. The accumulation layer 11 is activated by heat treatment (annealing) after ion implantation or diffusion of p-type impurities. The thickness of the accumulation layer 11 is 0.1 to 1 µm, for example.

The semiconductor photodetector SP1 includes an anti-reflection film AR1 disposed on the second main surface 1b. In the present embodiment, the anti-reflection film AR1 is a silicon oxide ($SiO_2$) film. The anti-reflection film AR1 is an oxide film that transmits incident light. The anti-reflection film AR1 is in contact with the slope 10a of the protrusion 10 to cover the slope 10a. An asperity corresponding to the plurality of protrusions 10 is formed on the surface of the anti-reflection film AR1. The thickness of the anti-reflection film AR1 is 1 to 200 nm, for example. For example, the anti-reflection film AR1 covers the entire region in which the plurality of protrusions 10 is formed.

Figure 3:
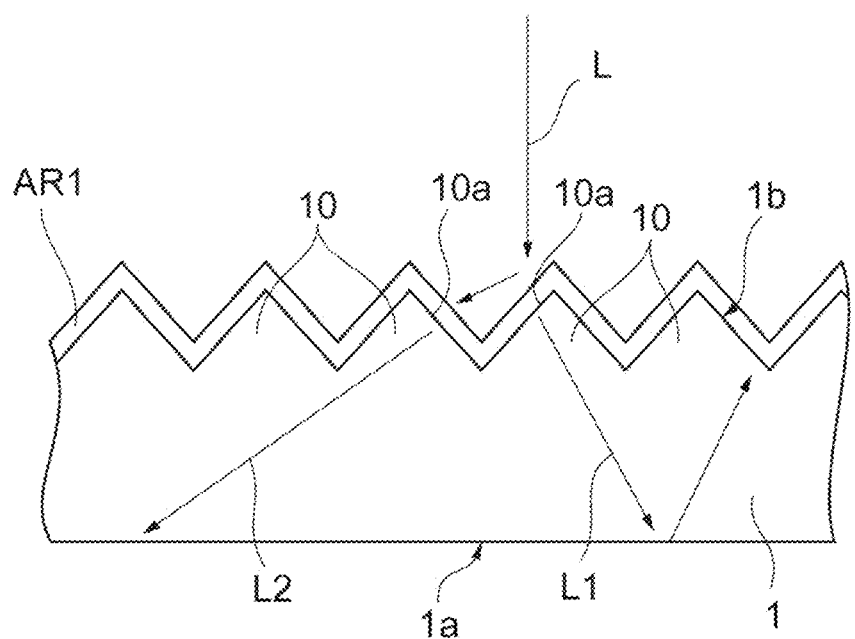
FIG. 3 is a schematic diagram illustrating traveling of light in the semiconductor photodetector according to the first embodiment.

As described above, in the present embodiment, the plurality of protrusions 10 formed on the second main surface 1b includes the slope 10a. When the light L is incident on the semiconductor substrate 1 from the second main surface 1b, the light is partially reflected on the second main surface 1b side, as illustrated in FIG. 3. Since the slope 10a is inclined with respect to the thickness direction of the semiconductor substrate 1, for example, the light reflected on the slope 10a side of one protrusion 10 is directed to the slope 10a side of the protrusion 10 adjacent to the one protrusion 10, so as to be incident on the semiconductor substrate 1 from the slope 10a of the adjacent protrusion 10. The light reflected on the second main surface 1b (slope 10a) side is incident again on the semiconductor substrate 1.

At the protrusion 10, the (111) surface of the semiconductor substrate 1 is exposed as the slope 10a. Therefore, the light incident on the semiconductor substrate 1 from the slope 10a tends to be taken into the semiconductor substrate 1. Since the height of the protrusion 10 is equal to or more than 200 nm, the surface area of the slope 10a is large. Therefore, a large amount of light incident on the slope 10a is taken into the semiconductor substrate 1.

The light in the ultraviolet wavelength region is absorbed in a region close to the second main surface 1b (slope 10a) of the semiconductor substrate 1 because of its large absorption coefficient by silicon. In the semiconductor photodetector SP1, since the (111) surface of the semiconductor substrate 1 is exposed at the protrusion 10 formed in the semiconductor substrate 1, absorption of light in a region close to the second main surface 1b is not inhibited.

Consequently, the semiconductor photodetector SP1 enhances spectral response in the ultraviolet wavelength band. The semiconductor photodetector SP1 enhances spectral response also in the near-infrared wavelength band for the following reasons.

As illustrated in FIG. 3, the light L1 incident on the semiconductor substrate 1 from the slope 10a travels in a direction crossing the thickness direction of the semiconductor substrate 1 and reaches the first main surface 1a, in some cases. The light L1 reaching the first main surface 1a is totally reflected by the first main surface 1a depending on the angle at which the light L1 reaches the first main surface 1a. This increases the traveling distance of the light incident on the semiconductor photodetector SP1 (the semiconductor substrate 1).

Light L2 incident again on the semiconductor substrate 1 travels through the inside of the semiconductor substrate 1 in a direction crossing the thickness direction of the semiconductor substrate 1. This also increases the traveling distance of the light L2 incident again on the semiconductor photodetector SP1 (semiconductor substrate 1).

An increase in the traveling distance of light traveling through the inside of the semiconductor substrate 1 leads to an increase in the distance over which light is absorbed. With this configuration, even the light in the near-infrared wavelength band where the absorption coefficient by silicon is small is absorbed by the semiconductor substrate 1. Therefore, the semiconductor photodetector SP1 enhances the spectral response in the near-infrared wavelength band.

In the semiconductor photodetector SP1, the accumulation layer 11 is provided on the second main surface 1b of the semiconductor substrate 1. The slope 10a of the protrusion 10 is included in the surface of the accumulation layer 11. With the accumulation layer 11, unnecessary carriers generated irrespective of light are recombined on the second main surface 1b side, and the dark current is reduced. The accumulation layer 11 suppresses carriers generated by light near the second main surface 1b of the semiconductor substrate 1 from being trapped on the second main surface 1b. Therefore, the carriers generated by light efficiently migrate on to pn junction formed by the semiconductor substrate 1 and the semiconductor layer 3.

Consequently, in the semiconductor photodetector SP1, the photodetection sensitivity is enhanced.

The semiconductor photodetector SP1 includes the anti-reflection film AR1 being a silicon oxide film. Therefore, light tends to be further taken in by the semiconductor substrate 1, and the spectral responses in the ultraviolet and near-infrared wavelength bands are further enhanced.

The present inventors conducted experiments to confirm the enhancement effects of the spectral responses according to the first embodiment.

The present inventors fabricated a semiconductor photodetector (referred to as Examples 1 and 2) having the above-described configuration and a semiconductor photodetector (referred to as Comparative Example 1) including no protrusion on the light incident surface of the semiconductor substrate, and examined individual spectral responses. Examples 1 and 2 and Comparative Example 1 have a same configuration except for the existence of protrusions. The size of the photosensitive region is set to 0.5 mmφ.

In Example 1 (refer to FIG. 4), the height of the protrusion 10 is 1570 nm. This value includes the thickness of the anti-reflection film AR1. In Example 2 (refer to FIG. 5), the height of the protrusion 10 is 1180 nm. This value also includes the thickness of the anti-reflection film AR1. FIG. 4 and FIG. 5(a) are SEM images of the surface of the semiconductor photodetector on the light incident surface side (surface of the anti-reflection film AR1) observed diagonally at 45°. FIG. 4 and FIG. 5(b) are SEM images of an end surface of the semiconductor photodetector.

Figure 6:
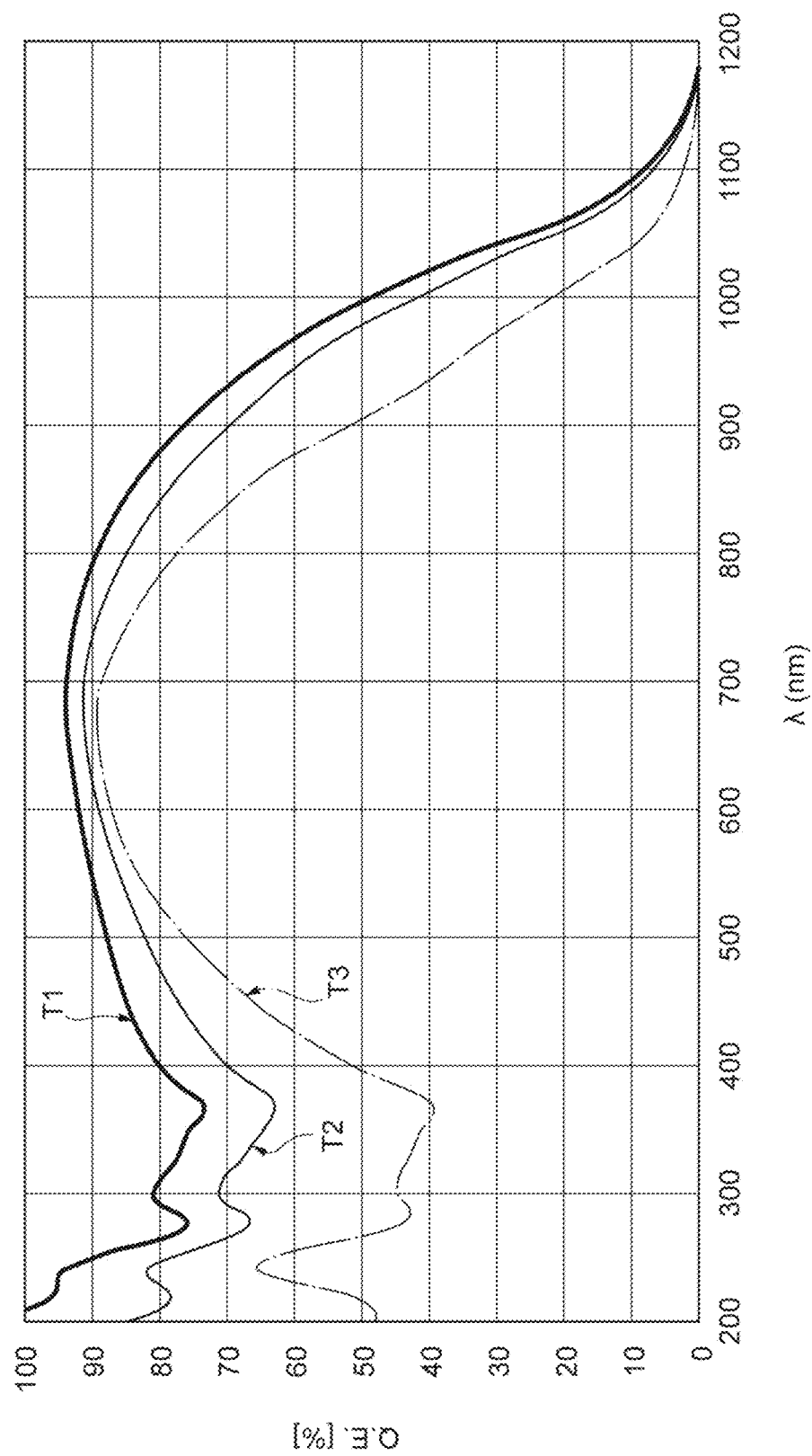
FIG. 6 is a graph illustrating changes in quantum efficiency with respect to wavelength in Examples 1 and 2 and Comparative Example 1.
Figure 7:
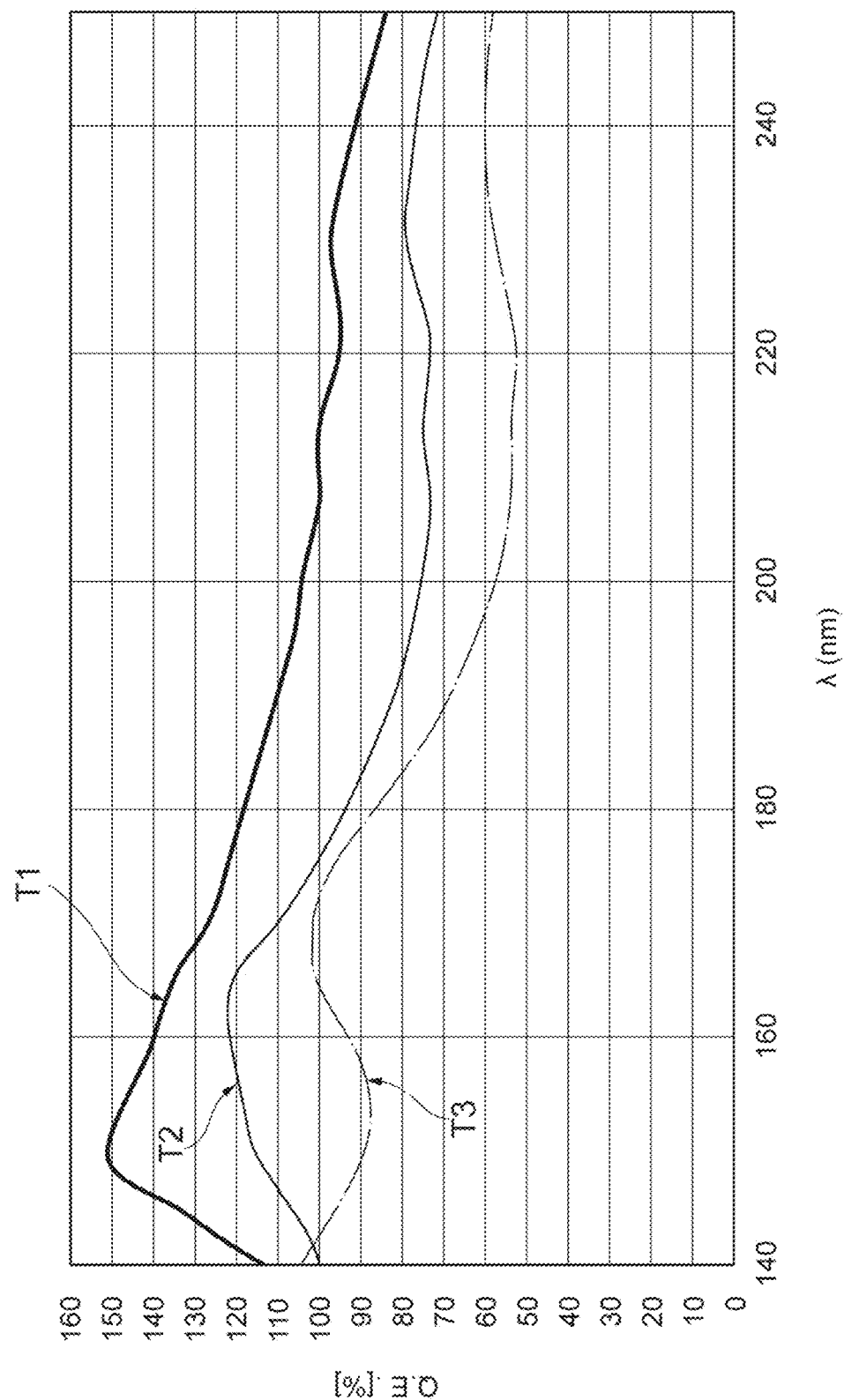
FIG. 7 is a graph illustrating a change in quantum efficiency with respect to wavelength in Examples 1 and 2 and Comparative Example 1.

Experimental results are illustrated in FIGS. 6 and 7. In FIGS. 6 and 7, the spectral response of Example 2 is indicated by T1, the spectral response of Example 1 is illustrated by T2, and the spectral response of Comparative Example 1 is illustrated by T3. In FIG. 6, the vertical axis represents quantum efficiency (Q.E.) and the horizontal axis represents the wavelength of light (nm). FIG. 7 illustrates spectral responses in the wavelength band of vacuum ultraviolet.

As seen from FIGS. 6 and 7, Examples 1 and 2 achieve great enhancement in the spectral sensitivity in the ultraviolet wavelength band as compared with Comparative Example 1. The spectral sensitivity in the near-infrared wavelength band is also enhanced in Examples 1 and 2, as compared with Comparative Example 1. In Example 1, the spectral responses in the ultraviolet and near-infrared wavelength bands are more enhanced as compared with Example 2.

Second Embodiment

Figure 8:
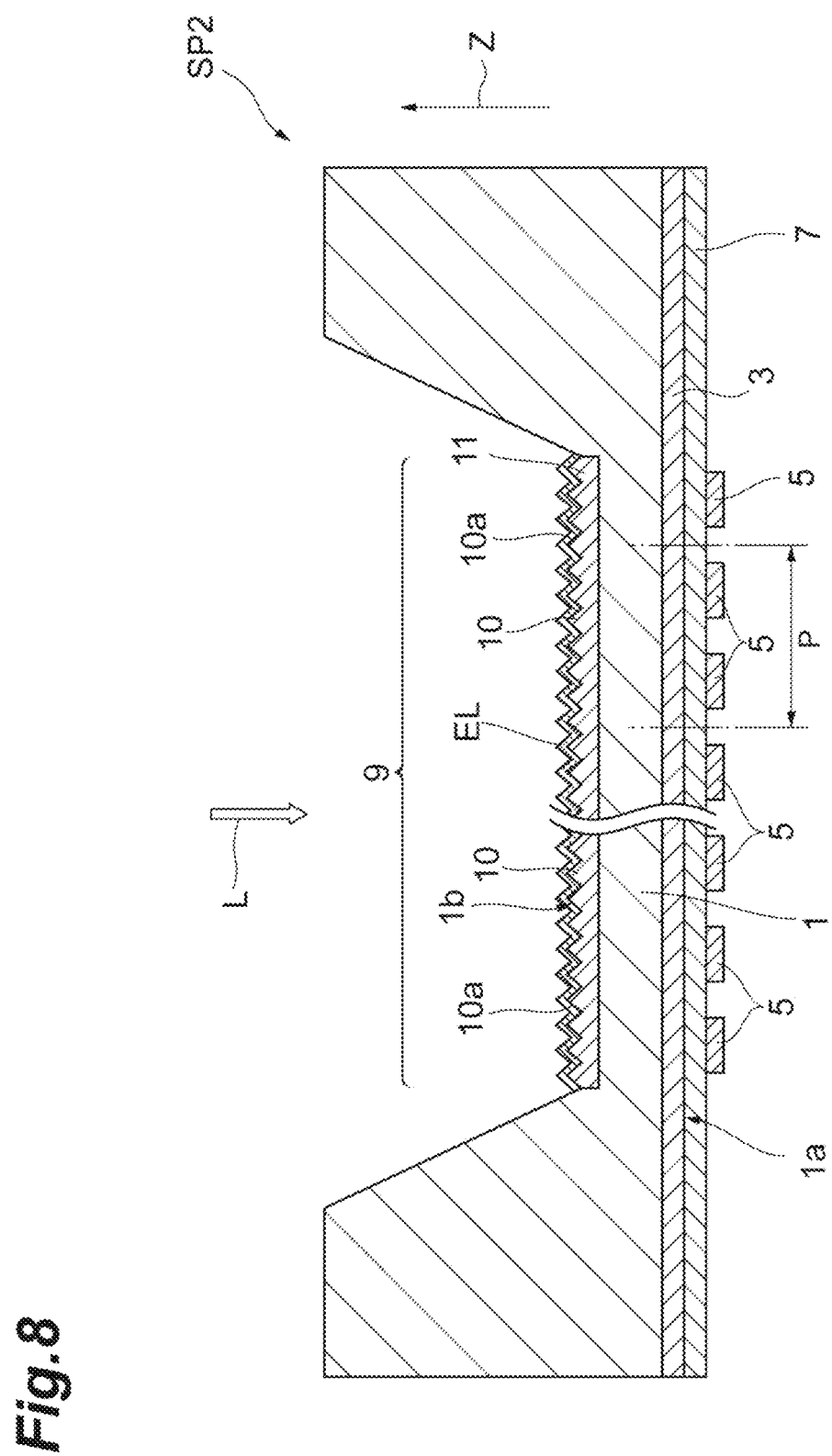
FIG. 8 is a diagram illustrating a cross-sectional configuration of a semiconductor photodetector according to a second embodiment.

A configuration of a semiconductor photodetector SP2 according to a second embodiment will be described with reference to FIG. 8. FIG. 8 is a diagram illustrating a cross-sectional configuration of the semiconductor photodetector according to the second embodiment.

The semiconductor photodetector SP2 includes a semiconductor substrate 1, a plurality of charge transfer electrodes 5, and an electrode film EL. The semiconductor photodetector SP2 differs from the semiconductor photodetector SP1 in that it includes the electrode film EL instead of the anti-reflection film AR1.

The electrode film EL is disposed on the semiconductor substrate 1. In the present embodiment, the electrode film EL is in contact with the semiconductor substrate 1. The electrode film EL transmits light incident on the semiconductor photodetector SP2 and is connected to a predetermined potential (for example, ground potential or negative potential). The electrode film EL is, for example, an electrode film transparent to the measured light (hereinafter sometimes simply referred to as "transparent electrode film"). Examples of the material of the transparent electrode film include tin-doped indium oxide (ITO), graphene, and carbon nanotube (CNT). The transparent electrode film may be an extremely thin metal film. An exemplary material of this metal film is TiPt. An asperity corresponding to the plurality of protrusions 10 is formed on the surface of the electrode film EL, as in the semiconductor substrate 1. The thickness of the electrode film EL is, 0.0003 to 3 μm, for example. For example, the electrode film EL covers the entire region in which the plurality of protrusions 10 is formed.

The semiconductor photodetector SP2 also achieves enhancement in spectral responses in each of wavelength bands of ultraviolet and near-infrared, similarly to the semiconductor photodetector SP1.

When the ultraviolet light is incident on the anti-reflection film AR1, a phenomenon (charge-up phenomenon) in which the anti-reflection film AR1 is charged might occur because the anti-reflection film AR1 is a silicon oxide film, that is, an oxide film. When the charge-up phenomenon occurs in the anti-reflection film AR1, the spectral response in the ultraviolet wavelength band is degraded due to the following reason.

In typical cases, an oxide film such as a silicon oxide film is charged to positive polarity. When ultraviolet light is irradiated on the oxide film, the charge amount of the oxide film increases. In the case where the accumulation layer 11 is a p-type semiconductor layer, an acceptor as an impurity atom charged to the positive polarity exists in the accumulation layer 11. The charge with positive polarity on the oxide film repels the positively charged holes existing in the accumulation layer 11. Therefore, the potential slope in the semiconductor substrate 1 formed by the accumulation layer 11 is bent toward the incident surface side of the ultraviolet light in the vicinity of the second main surface 1b. The incident ultraviolet light generates a photoelectric reaction in the vicinity of the surface of the semiconductor substrate 1. The electrons generated by the photoelectric reaction are led to the second main surface 1b side, rather than the first main surface 1a side where charge transfer is performed. The electrons led to the second main surface 1b side are eliminated by recombination, and thus not taken out as a signal output. This results in the decrease in the sensitivity in the ultraviolet wavelength band.

In contrast, the semiconductor photodetector SP2 includes no anti-reflection film AR1, this configuration suppresses the decrease in the sensitivity in the ultraviolet wavelength band, generated by the charging of the anti-reflection film AR1. Moreover, the potential of the surface of the semiconductor substrate 1 is constantly maintained at a certain level by the electrode film EL located on the surface of the semiconductor substrate 1. Therefore, in the semiconductor photodetector SP2, the degradation of the spectral response in the ultraviolet wavelength band is suppressed. The action and effect of the electrode film EL are achieved even in the semiconductor photodetector including no protrusion 10.

Third Embodiment

Figure 9:
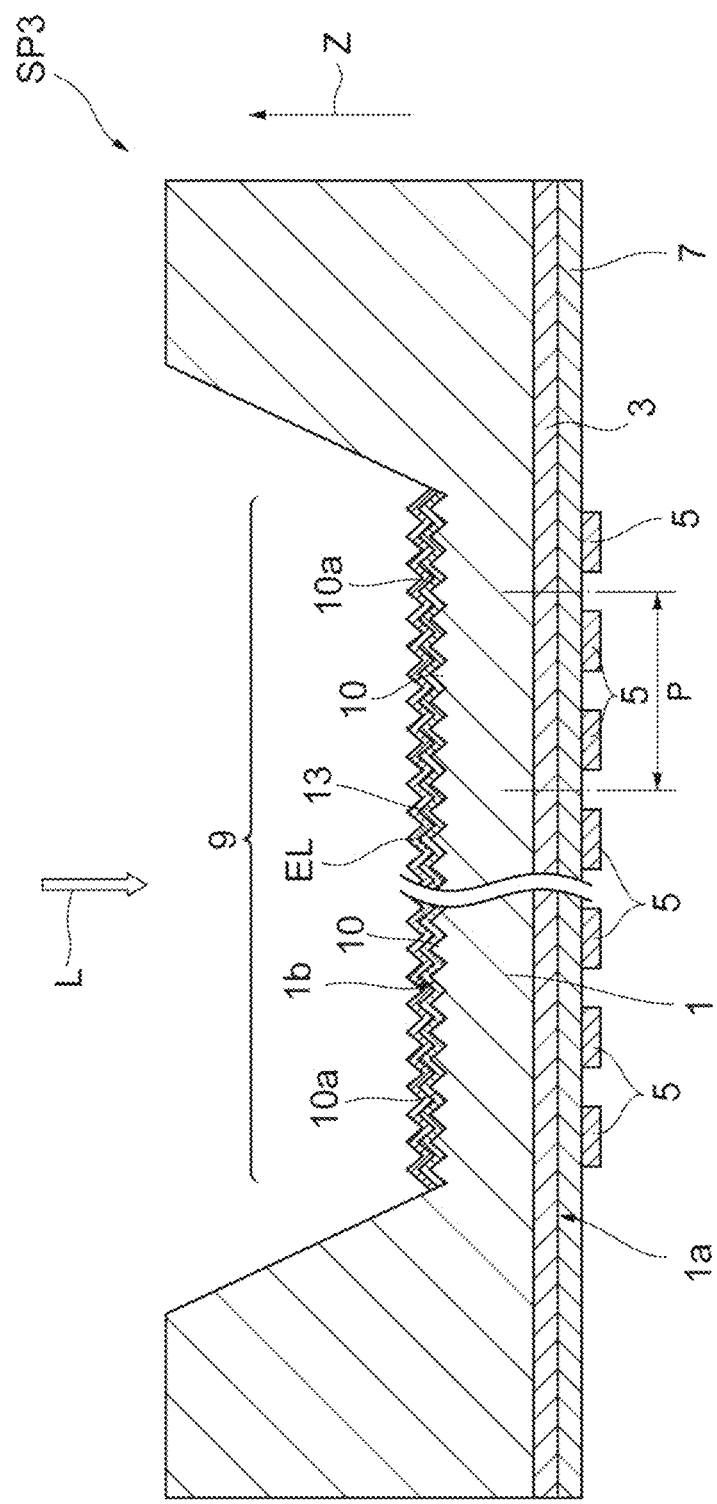
FIG. 9 is a diagram illustrating a cross-sectional configuration of a semiconductor photodetector according to a third embodiment.

A configuration of a semiconductor photodetector SP3 according to a third embodiment will be described with reference to FIG. 9. FIG. 9 is a diagram illustrating the cross-sectional configuration of the semiconductor photodetector according to the third embodiment.

The semiconductor photodetector SP3 includes a semiconductor substrate 1, a plurality of charge transfer electrodes 5, an aluminum oxide ($Al_2O_3$) film 13, and an electrode film EL. The semiconductor photodetector SP2 is different from the semiconductor photodetector SP2 in that it includes the aluminum oxide film 13.

The aluminum oxide film 13 is disposed on the second main surface 1b. The aluminum oxide film 13 is an oxide film that transmits incident light. The thickness of the aluminum oxide film 13 is 0.0003 to 3 µm, for example. An asperity corresponding to the plurality of protrusions 10 is formed on the surface of the aluminum oxide film 13. For example, the aluminum oxide film 13 covers the entire region where the plurality of protrusions 10 is formed.

The aluminum oxide film 13 is charged to negative polarity. Since the conductivity type of the semiconductor substrate 1 is p-type, a predetermined fixed charge (a fixed charge of positive polarity) exists on the second main surface 1b side of the semiconductor substrate 1 by the aluminum oxide film 13. The region on the second main surface b side of the semiconductor substrate 1 where the fixed charge of positive polarity exists functions as an accumulation layer. Therefore, the semiconductor photodetector SP3 does not include the accumulation layer 11 on the semiconductor substrate 1.

The aluminum oxide film 13 may be disposed on the second main surface 1b via the silicon oxide film. Even in this case, the fixed charge of positive polarity exists on the second main surface 1b side of the semiconductor substrate 1 by the aluminum oxide film 13.

The electrode film EL is disposed on the aluminum oxide film 13. The electrode film EL is in contact with the aluminum oxide film 13. Also in the present embodiment, the electrode film EL is, for example, an electrode film that is transparent with respect to measured light. Examples of the material of the transparent electrode film include ITO, graphene, and CNT. The transparent electrode film may be an extremely thin metal film. An exemplary material of this metal film is TiPt. The electrode film EL is connected to a predetermined potential (for example, a ground potential or a negative potential). The thickness of the electrode film EL is, 0.0003 to 3 µm, for example. The electrode film EL covers the entire aluminum oxide film 13, for example.

The semiconductor photodetector SP3 also achieves enhancement in spectral responses in each of wavelength bands of ultraviolet and near-infrared, similarly to the semiconductor photodetectors SP1 and SP2. There is no need to provide the accumulation layer 11 on the semiconductor substrate 1 in the semiconductor photodetector SP3, so that the manufacturing process of the semiconductor photodetector SP3 is simplified.

When ultraviolet light becomes incident on the aluminum oxide film 13, the aluminum oxide film 13 is charged similarly to the anti-reflection film AR1. In this case, the charged state of the aluminum oxide film 13 shifts from negative polarity to an electrically neutralized state. In the semiconductor photodetector SP3, since the electrode film EL connected to the predetermined potential is disposed on the aluminum oxide film 13, charging of the aluminum oxide film 13 is suppressed. Therefore, the semiconductor photodetector SP3 also suppresses the degradation of the spectral response in the ultraviolet wavelength band. The action and effect of the electrode film EL are achieved even in the semiconductor photodetector including no protrusion 10.

In a case where the electrode film EL is a film made of graphene or CNT, for example, the transmittance of light in the ultraviolet wavelength band is high, that is, the decrease in the transmission characteristic in the ultraviolet wavelength band is suppressed, as compared with the ITO film. Consequently, the decrease in the spectral response in the ultraviolet wavelength band due to the electrode film EL is suppressed.

Fourth Embodiment

Figure 10:
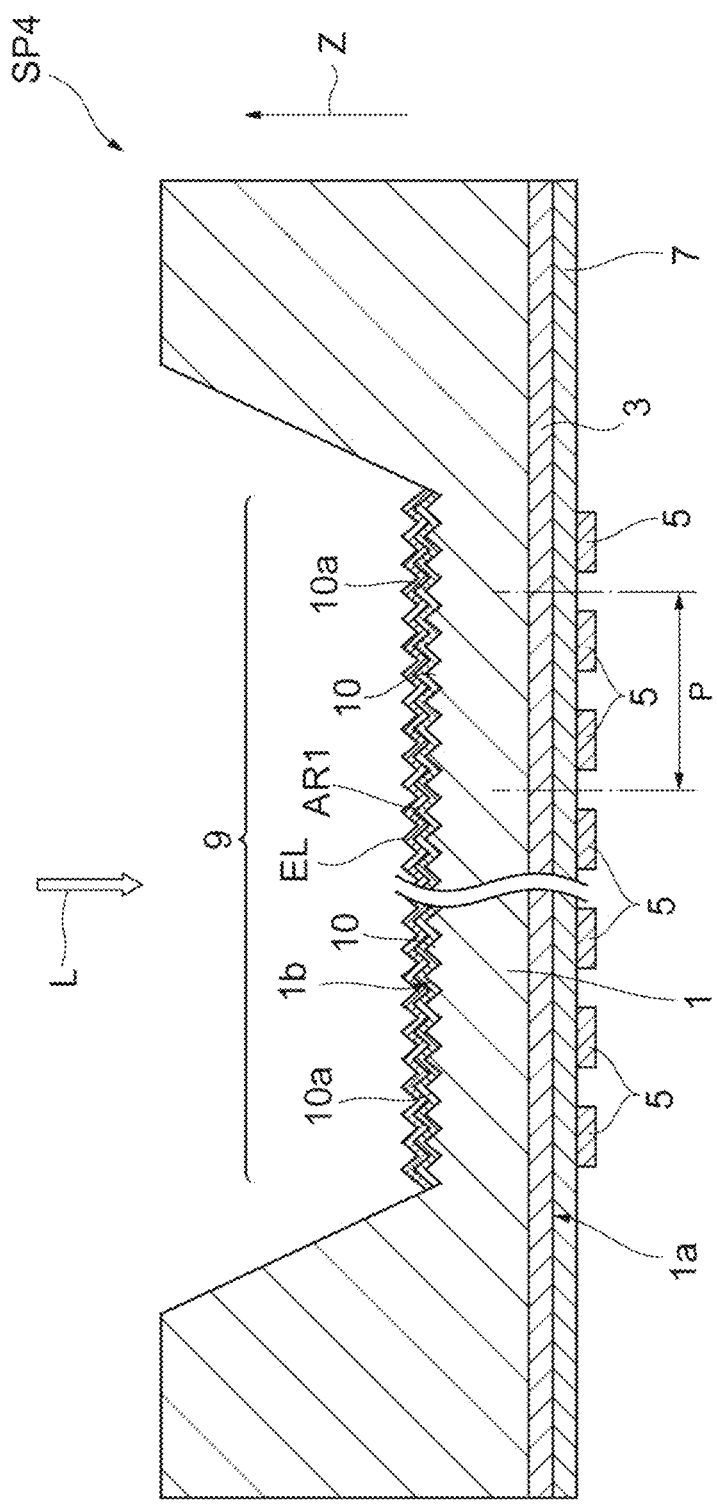
FIG. 10 is a diagram illustrating a cross-sectional configuration of a semiconductor photodetector according to a fourth embodiment.

A configuration of a semiconductor photodetector SP4 according to a fourth embodiment will be described with reference to FIG. 10. FIG. 10 is a diagram illustrating the cross-sectional configuration of the semiconductor photodetector according to the fourth embodiment.

The semiconductor photodetector SP4 includes a semiconductor substrate 1, a plurality of charge transfer electrodes 5, an anti-reflection film AR1, and an electrode film EL. The semiconductor photodetector SP4 differs from the semiconductor photodetector SP2 in that the accumulation layer 11 is not provided on the semiconductor substrate 1.

Also in the present embodiment, the electrode film EL is, for example, an electrode film that is transparent with respect to measured light. Examples of the material of the transparent electrode film include ITO, graphene, and CNT. The transparent electrode film may be an extremely thin metal film. An exemplary material of this metal film is TiPt. The electrode film EL is connected to a predetermined potential (for example, a negative potential). The electrode film EL is disposed on the second main surface 1b via the anti-reflection film AR1 (silicon oxide film). The electrode film EL is in contact with the anti-reflection film AR1. The thickness of the electrode film EL is, 0.0003 to 3 µm, for example. The electrode film EL covers the entire anti-reflection film AR1, for example.

The electrode film EL is connected to a negative potential. Since the conductivity type of the semiconductor substrate 1 is p-type, a predetermined fixed charge (a fixed charge of positive polarity) exists on the second main surface 1b side of the semiconductor substrate 1 by the electrode film EL. The region on the second main surface 1b side of the semiconductor substrate 1 where the fixed charge of positive polarity exists functions as an accumulation layer.

The semiconductor photodetector SP4 also achieves enhancement in spectral responses in each of wavelength bands of ultraviolet and near-infrared, similarly to the semiconductor photodetectors SP1, SP2, and SP3. There is no need to provide the accumulation layer 11 on the semiconductor substrate 1 also in the semiconductor photodetector SP4, so that the manufacturing process of the semiconductor photodetector SP4 is simplified.

In the semiconductor photodetector SP4, since the electrode film EL connected to the negative potential is disposed on the anti-reflection film AR1, a potential slope is constantly formed within the semiconductor substrate 1 regardless of whether the anti-reflection film AR1 is charged. Therefore, the semiconductor photodetector SP4 suppresses the degradation of the spectral response in the ultraviolet wavelength band.

Fifth Embodiment

Figure 11:
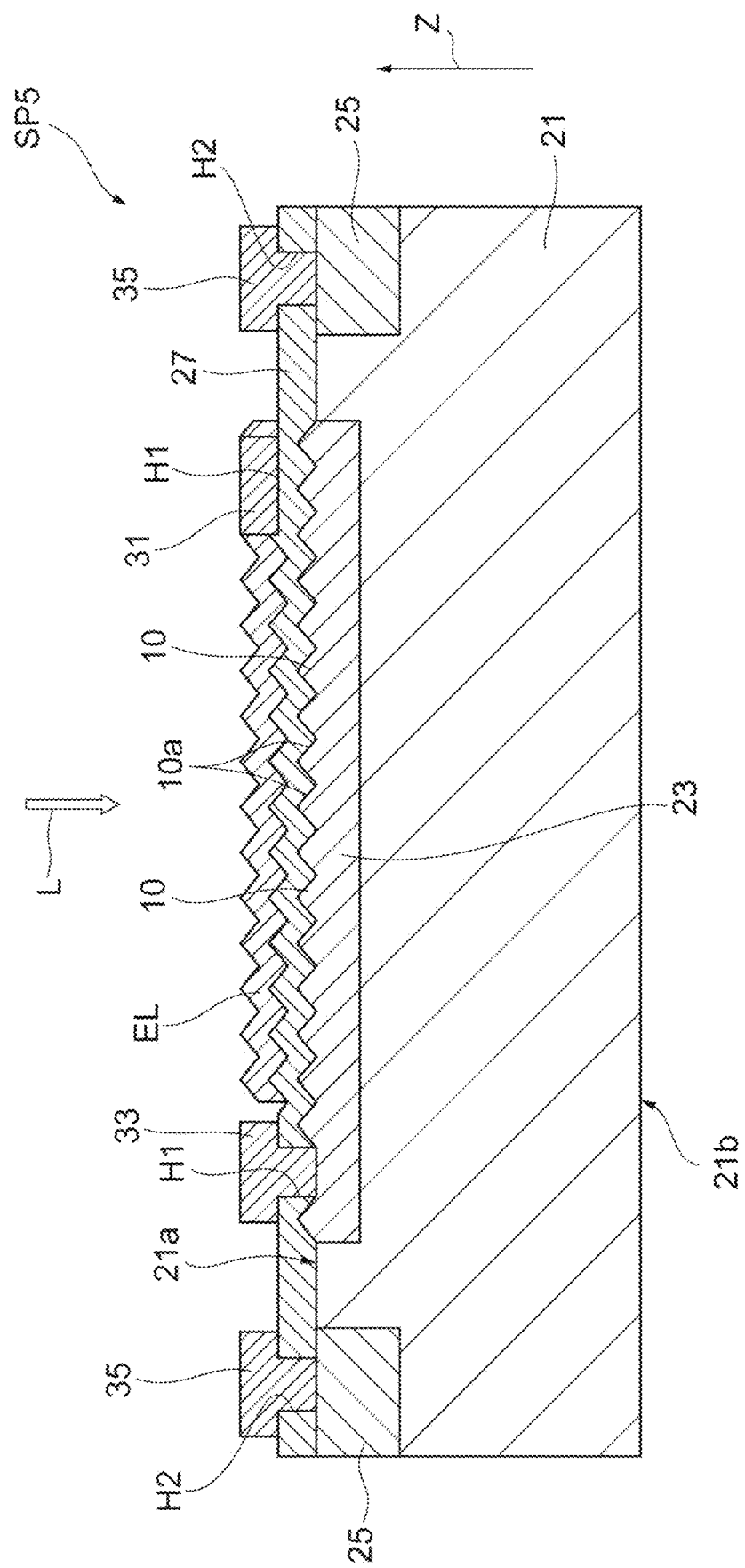
FIG. 11 is a diagram illustrating a cross-sectional configuration of a semiconductor photodetector according to a fifth embodiment.

A configuration of a semiconductor photodetector SP5 according to a fifth embodiment will be described with reference to FIG. 11. FIG. 11 is a diagram illustrating the cross-sectional configuration of the semiconductor photodetector according to the fifth embodiment.

As illustrated in FIG. 11, the semiconductor photodetector SP5 is a front-illuminated photodiode. The semiconductor photodetector SP5 includes an n-type semiconductor substrate 21. The semiconductor substrate 21 is made of silicon (Si) crystal, and includes a first main surface 21a and a second main surface 21b opposing each other. The semiconductor substrate 21 is a silicon substrate having a surface orientation (100). The first main surface 21a is a light incident surface, and the second main surface 21b is a back surface of the light incident surface. The thickness of the semiconductor substrate 21 is 200 to 500 µm, for example. The thickness direction of the semiconductor substrate 21 is a direction parallel to the Z axis.

On the first main surface 21a side of the semiconductor substrate 21, a p$^+$-type semiconductor region 23 and an n$^+$-type semiconductor region 25 are provided. A pn junction is formed between the semiconductor substrate 21 and the semiconductor region 23. The thickness of the semiconductor region 23 is 1.5 to 3.0 µm, for example. In the present embodiment, the semiconductor region 23 is formed by ion-implanting or diffusing p-type impurities from the first main surface 21a side in the semiconductor substrate 21. The semiconductor region 25 is formed by ion-implanting or diffusing n-type impurities from the first main surface 21a side in the semiconductor substrate 21.

The sign "+" attached to the conductivity type indicates that the impurity concentration is high, for example, the impurity concentration is about $1\times10^{17}$ cm$^{-3}$ or more. The sign "−" attached to the conductivity type indicates that the impurity concentration is low, for example, the impurity concentration is about $1\times10^{15}$ cm$^{-3}$ or less.

A plurality of protrusions 10 is formed on the first main surface 21a of the semiconductor substrate 21. In the present embodiment, the plurality of protrusions 10 is formed over the entire region corresponding to the semiconductor region 23 on the first main surface 21a. A slope 10a of the protrusion 10 is included in the surface of the semiconductor region 23. Each of the protrusions 10 has a substantially conical shape and includes the slope 10a inclined with respect to the thickness direction of the semiconductor substrate 21, like the first embodiment. At the protrusion 10, the (111) surface of the semiconductor substrate 21 is exposed as the slope 10a. The protrusion 10 may be formed in a region other than the region corresponding to the semiconductor region 23 on the first main surface 21a. That is, the protrusion 10 may be formed over the entire first main surface 21a.

An insulating layer 27 is disposed on the first main surface 21a of the semiconductor substrate 21. The insulating layer 27 is a silicon oxide (SiO$_2$) film. That is, the insulating layer 27 is an oxide film that transmits incident light. The insulating layer 27 is in contact with the slope 10a to cover the slope 10a of the protrusion 10. An asperity corresponding to the plurality of protrusions 10 is formed on the surface of the insulating layer 27. The thickness of the insulating layer 27 is 1 to 200 nm, for example. The insulating layer 27 may function as an anti-reflection film.

The semiconductor photodetector SP5 includes the electrode film EL. The electrode film EL is disposed on the insulating layer 27. The electrode film EL is in contact with the insulating layer 27. Also in the present embodiment, the electrode film EL is, for example, an electrode film that is transparent with respect to measured light. Examples of the material of the transparent electrode film include ITO, graphene, and CNT. The transparent electrode film may be an extremely thin metal film. An exemplary material of this metal film is TiPt. The electrode film EL is connected to a predetermined potential (for example, a ground potential or a negative potential) through the electrode 31. The electrode 31 is in electrical contact with and connected to the electrode film EL. The thickness of the electrode film EL is, 0.0003 to 3 µm, for example.

The semiconductor photodetector SP5 includes electrodes 33 and 35. The electrode 33 is in electrical contact with and connected to the semiconductor region 23 through a contact hole H1 formed in the insulating layer 27. The electrode 35 is in electrical contact with and connected to the semiconductor region 25 through a contact hole H2 formed in the insulating layer 27.

The semiconductor photodetector SP5 also achieves enhancement in spectral responses in each of wavelength bands of ultraviolet and near-infrared, similarly to the semiconductor photodetectors SP1, SP2, SP3, and SP4.

In the semiconductor photodetector SP5, since the electrode film EL (transparent electrode film) connected to the ground potential or the negative potential is disposed on the insulating layer 27, charging of the insulating layer 27 is suppressed. Therefore, the semiconductor photodetector SP5 suppresses the degradation of the spectral response in the ultraviolet wavelength band.

In the case where the electrode film EL is a film made of graphene or CNT, a decrease in the transmission characteristics in the ultraviolet wavelength band is suppressed as described above. Consequently, the decrease in the spectral response in the ultraviolet wavelength band due to the electrode film EL is suppressed.

Sixth Embodiment

Figure 12:
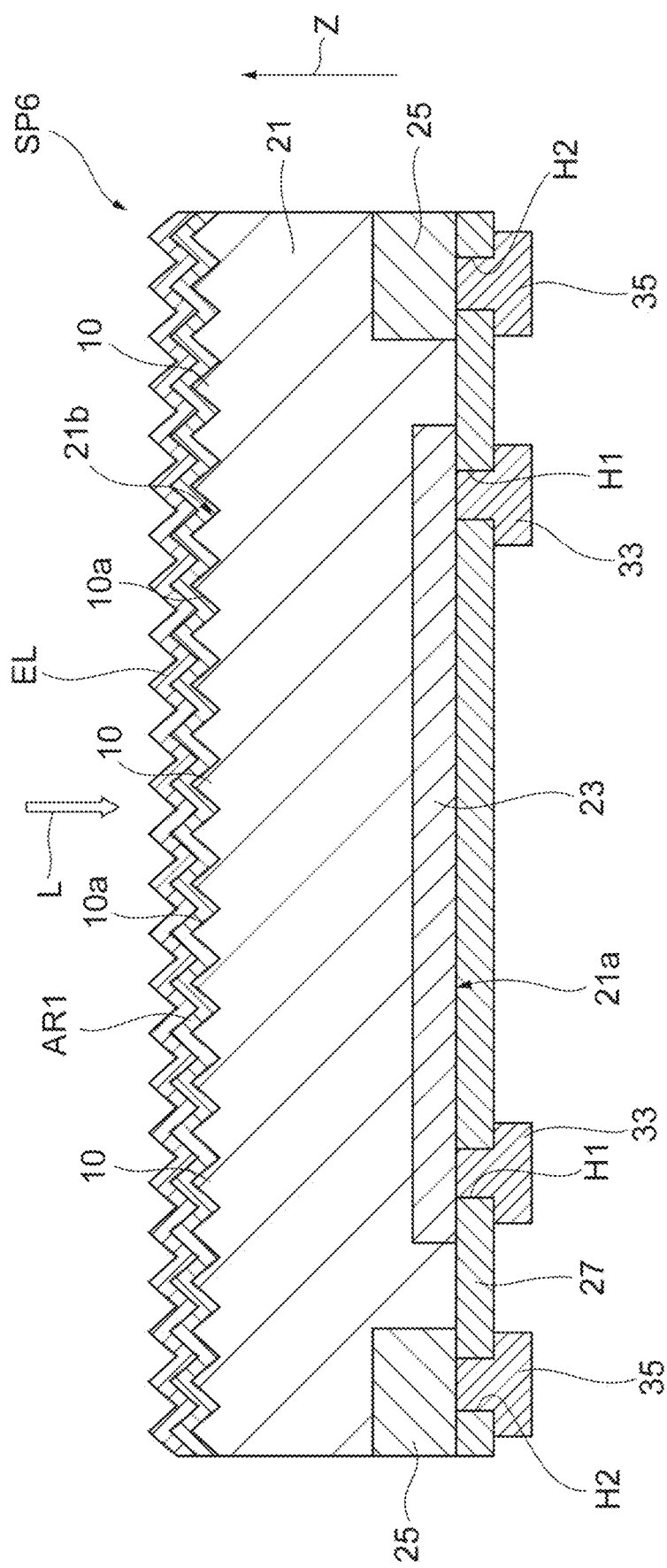
FIG. 12 is a diagram illustrating a cross-sectional configuration of a semiconductor photodetector according to a sixth embodiment.

A configuration of a semiconductor photodetector SP6 according to a sixth embodiment will be described with reference to FIG. 12. FIG. 12 is a diagram illustrating the cross-sectional configuration of the semiconductor photodetector according to the sixth embodiment.

As illustrated in FIG. 12, the semiconductor photodetector SP6 is a back-illuminated photodiode. The semiconductor photodetector SP6 includes a semiconductor substrate 21, an anti-reflection film AR1 (silicon oxide film), and an electrode film EL. Also in the sixth embodiment, the electrode film EL is, for example, an electrode film that is transparent with respect to measured light. Examples of the material of the transparent electrode film include ITO, graphene, and CNT. The transparent electrode film may be an extremely thin metal film. An exemplary material of this metal film is TiPt. The second main surface 21b is a light incident surface, and the first main surface 21a is a back surface of the light incident surface. The thickness of the semiconductor substrate 21 is 100 to 200 urn, for example.

A plurality of protrusions 10 is formed on the second main surface 21b of the semiconductor substrate 21. In the present embodiment, the plurality of protrusions 10 is formed over the entire second main surface 21b. Each of the protrusions 10 has a substantially conical shape and includes a slope 10a inclined with respect to the thickness direction of the semiconductor substrate 21, like the first embodiment. At the protrusion 10, the (111) surface of the semiconductor substrate 21 is exposed as the slope 10a. The protrusion 10 may be formed only in a region corresponding to the semiconductor region 23 on the second main surface 21b.

The anti-reflection film AR1 is disposed on the second main surface 21b. In the present embodiment, the anti-reflection film AR1 is also in contact with the slope 10a to cover the slope 10a of the protrusion 10. The thickness of the anti-reflection film. AR1 is 1 to 200 µm, for example.

The electrode film EL (transparent electrode film) is connected to a predetermined potential (for example, a ground potential or a negative potential). The electrode film EL is disposed on the second main surface 1b via the anti-reflection film AR1 (silicon oxide film). The thickness of the electrode film EL is, 0.0003 to 3 μm, for example.

The semiconductor photodetector SP6 also achieves enhancement in spectral responses in each of wavelength bands of ultraviolet and near-infrared, similarly to the semiconductor photodetectors SP1, SP2, SP3, SP4, and SP5.

In the semiconductor photodetector SP6, since the electrode film EL (transparent electrode film) connected to the ground potential or the negative potential is disposed on the anti-reflection film AR1, charging of the anti-reflection film AR1 is suppressed. Therefore, the semiconductor photodetector SP6 suppresses the degradation of the spectral response in the ultraviolet wavelength band.

In a case where the electrode film EL is a film made of graphene or CNT, the decrease in the transmission characteristics in the ultraviolet wavelength band is suppressed as described above. Consequently, the decrease in the spectral response in the ultraviolet wavelength band due to the electrode film EL is suppressed.

Seventh Embodiment

Figure 13:
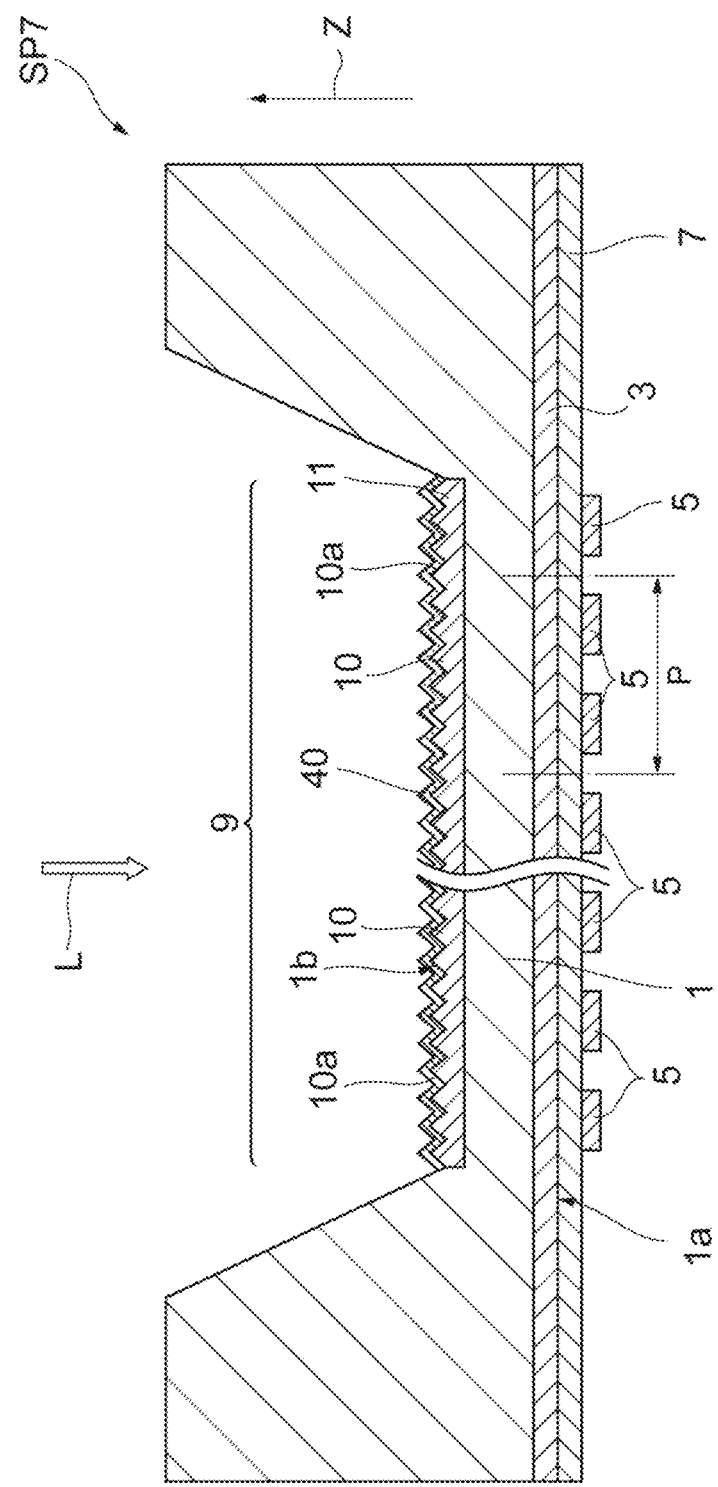
FIG. 13 is a diagram illustrating a cross-sectional configuration of a semiconductor photodetector according to a seventh embodiment.

A configuration of a semiconductor photodetector SP7 according to a seventh embodiment will be described with reference to FIG. 13. FIG. 13 is a diagram illustrating the cross-sectional configuration of the semiconductor photodetector according to the seventh embodiment.

The semiconductor photodetector SP7 includes a semiconductor substrate 1, a plurality of charge transfer electrodes 5, and a film 40 containing boron. The semiconductor photodetector SP7 is different from the semiconductor photodetector SP1 in that the film 40 is provided instead of the anti-reflection film AR1.

The film 40 is disposed on the second main surface 1b and transmits incident light. The film 40 is in contact with the second main surface 1b. In the present embodiment, the film 40 is a film made of boron. The film 40 is in contact with a slope 10a to cover the slope 10a of the protrusion 10. An asperity corresponding to the plurality of protrusions 10 are formed on the surface of the film 40. The thickness of the film 40 is 1 to 30 nm, for example. For example, the film 40 covers the entire region in which the plurality of protrusions 10 is formed.

The semiconductor photodetector SP7 also achieves enhancement in spectral responses in each of wavelength bands of ultraviolet and near-infrared, similarly to the semiconductor photodetectors SP1, SP2, SP3, SP4, SP5, and SP6.

In the semiconductor photodetector SP7, since the film 40 containing boron is disposed on the second main surface 1b (light incident surface), degradation of the spectral response in the ultraviolet wavelength band is suppressed.

Eighth Embodiment

Figure 14:
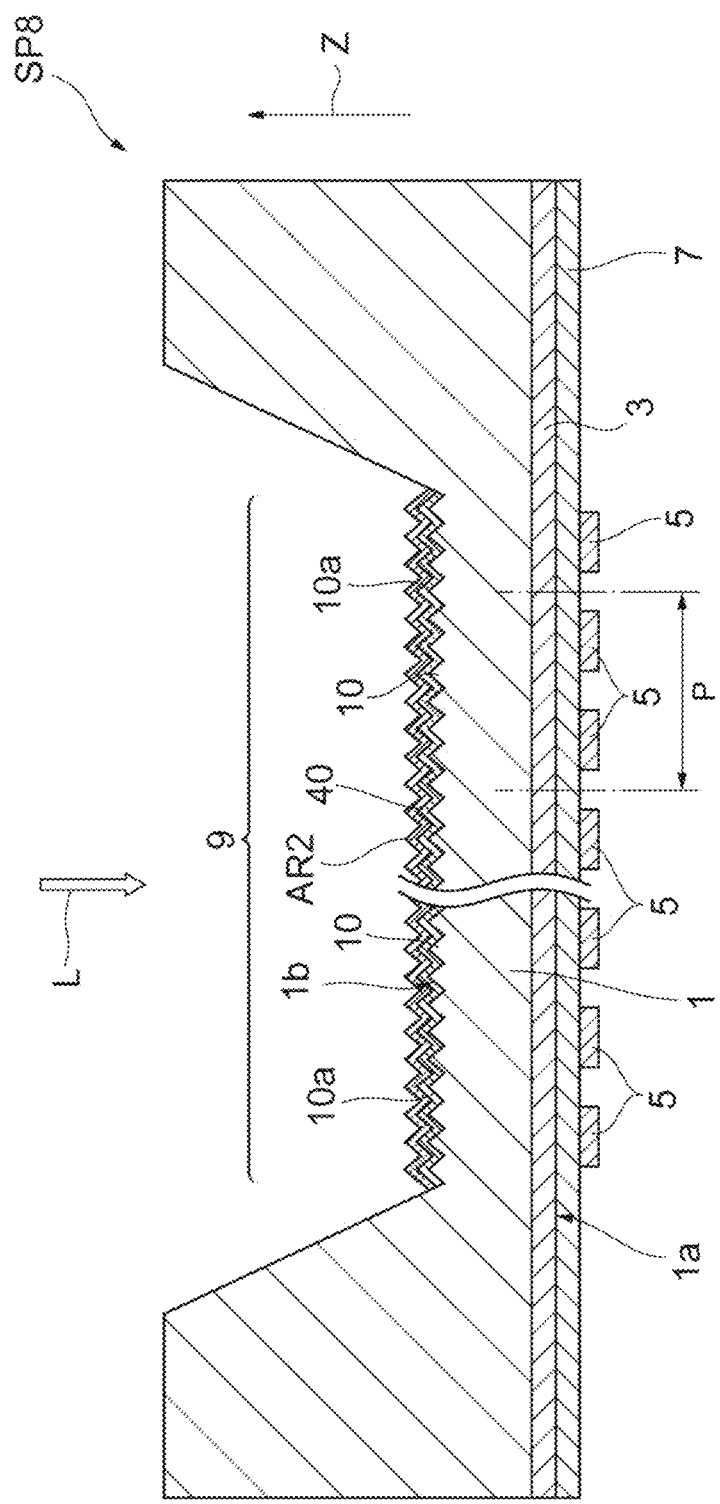
FIG. 14 is a diagram illustrating a cross-sectional configuration of a semiconductor photodetector according to an eighth embodiment.

A configuration of a semiconductor photodetector SP8 according to an eighth embodiment will be described with reference to FIG. 14. FIG. 14 is a diagram illustrating the cross-sectional configuration of the semiconductor photodetector according to the eighth embodiment.

The semiconductor photodetector SP8 includes a semiconductor substrate 1, a plurality of charge transfer electrodes 5, a film 40 containing boron, and an anti-reflection film AR2. The semiconductor photodetector SP8 is different from the semiconductor photodetector SP7 in that it includes the anti-reflection film AR2.

The anti-reflection film AR2 is disposed on the film 40. The anti-reflection film AR2 is in contact with the film 40. In the present embodiment, the anti-reflection film AR2 is an aluminum oxide ($Al_2O_3$) film. The anti-reflection film AR2 is an oxide film that transmits incident light. The anti-reflection film AR2 covers the entire film 40, for example. In the present embodiment, the film 40 is also a film made of boron. The thickness of the anti-reflection film AR2 is 0.01 to 1 μm, for example.

The semiconductor photodetector SP8 also achieves enhancement in spectral responses in each of wavelength bands of ultraviolet and near-infrared, similarly to the semiconductor photodetectors SP1, SP2, SP3, SP4, SP5, SP6, and SP7. Since the semiconductor photodetector SP8 includes the anti-reflection film AR2, light tends to be further taken in by the semiconductor substrate 1. Consequently, in the semiconductor photodetector SP8, the spectral responses in the ultraviolet and near-infrared wavelength bands are further enhanced.

In, the semiconductor photodetector SP8, as in the semiconductor photodetector SP7, since the film 40 containing boron is disposed on the second main surface 1b (light incident surface), degradation of the spectral response in the ultraviolet wavelength band is suppressed.

Ninth Embodiment

Figure 15:
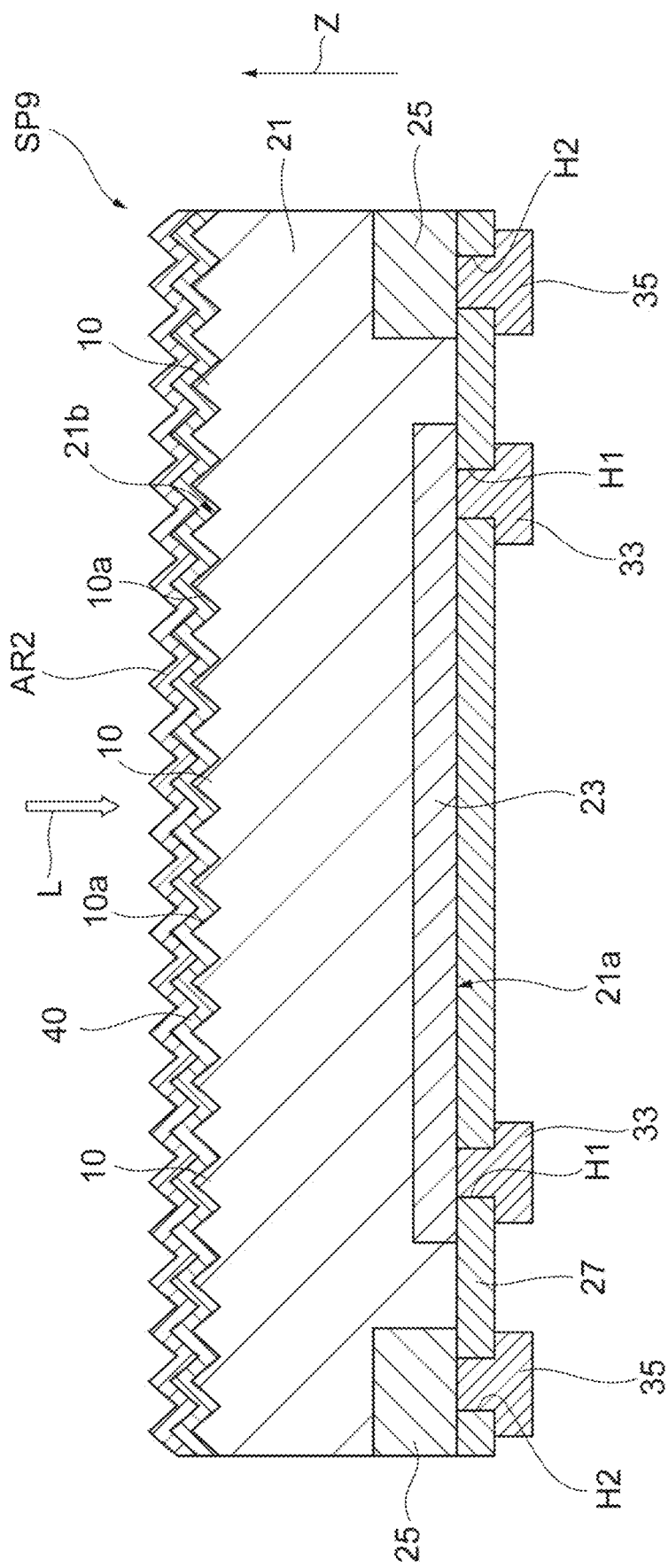
FIG. 15 is a diagram illustrating a cross-sectional configuration of a semiconductor photodetector according to a ninth embodiment.

A configuration of a semiconductor photodetector SP9 according to a ninth embodiment will be described with reference to FIG. 15. FIG. 15 is a diagram illustrating the cross-sectional configuration of the semiconductor photodetector according to the ninth embodiment.

The semiconductor photodetector SP9 is a back-illuminated photodiode, similarly to the semiconductor photodetector SP6. The semiconductor photodetector SP9 includes a semiconductor substrate 21, a film 40 containing boron, and an anti-reflection film AR2 (aluminum oxide film). The semiconductor photodetector SP9 is different from the semiconductor photodetector SP6 in that it includes the film 40 and the anti-reflection film AR2.

The film 40 is disposed on the second main surface 21b. The film 40 is in contact with a slope 10a to cover the slope 10a of the protrusion 10. The film 40 is in contact with the second main surface 21b. The thickness of the film 40 is 1 to 30 nm, for example. In the present embodiment, the film 40 is also a film made of boron. For example, the film 40 covers the entire region in which the plurality of protrusions 10 is formed.

The anti-reflection film AR2 is disposed on the second main surface 1b via the film 40. The anti-reflection film AR2 is in contact with the film 40. The thickness of the anti-reflection film AR2 is 0.01 to 1 μm, for example.

The semiconductor photodetector SP9 also achieves enhancement in spectral responses in each of wavelength bands of ultraviolet and near-infrared, similarly to the semiconductor photodetectors SP1, SP2, SP3, SP4, SP5, SP6, SP7, and SP8. Since the semiconductor photodetector SP9 includes the anti-reflection film AR2, the spectral responses in the ultraviolet and near-infrared wavelength bands is further enhanced in the semiconductor photodetector SP9 as described above.

In the semiconductor photodetector SP9, as in the semiconductor photodetectors SP7 and SP8, since the film 40 containing boron is disposed on the second main surface 21b (light incident surface), degradation of the spectral response in the ultraviolet wavelength band is suppressed.

Tenth Embodiment

Figure 16:
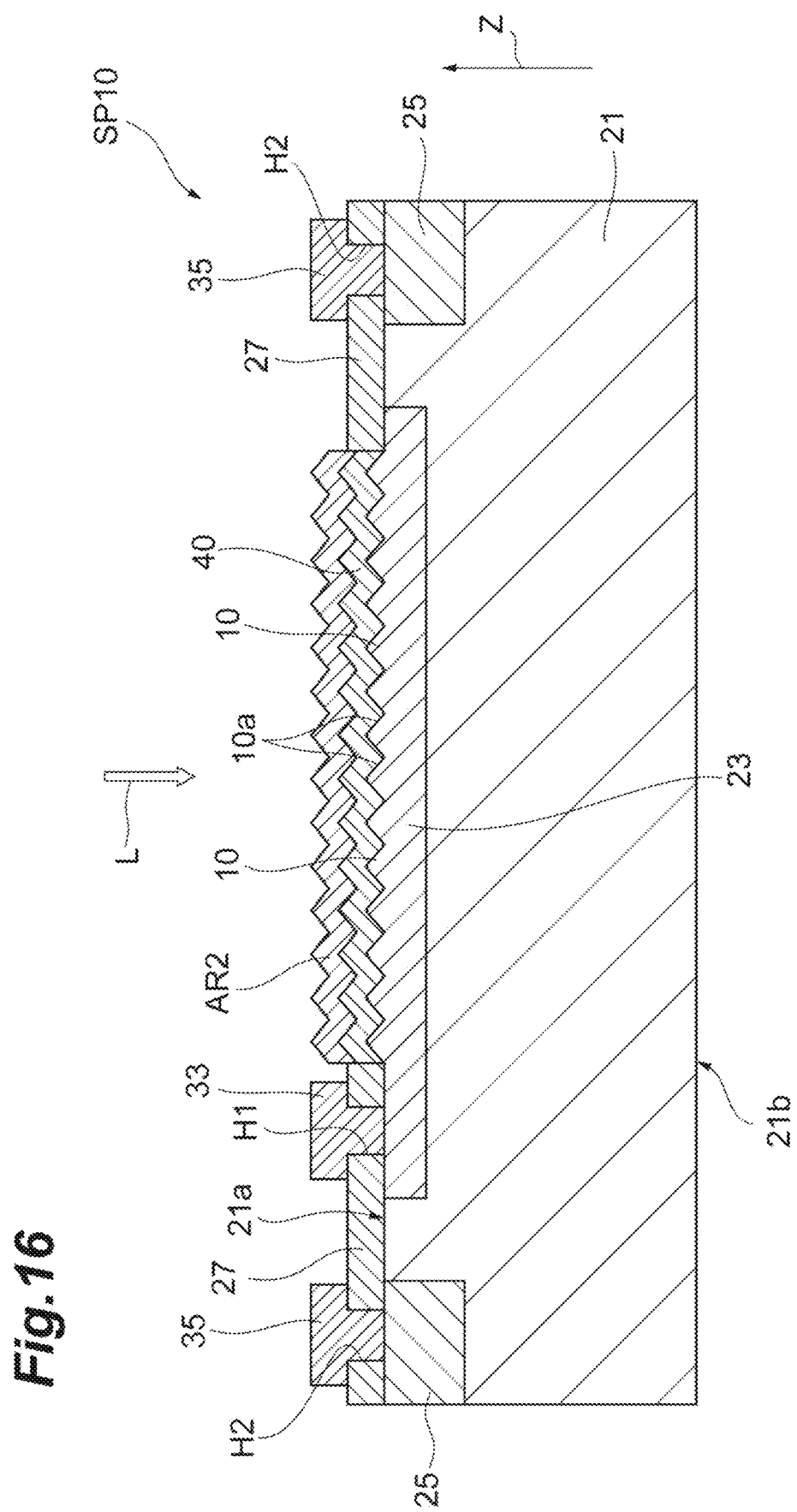
FIG. 16 is a diagram illustrating a cross-sectional configuration of a semiconductor photodetector according to a tenth embodiment.

A configuration of a semiconductor photodetector SP10 according to a tenth embodiment will be described with reference to FIG. 16. FIG. 16 is a diagram illustrating the cross-sectional configuration of the semiconductor photodetector according to the tenth embodiment.

The semiconductor photodetector SP10 is a front-illuminated photodiode, similarly to the semiconductor photodetector SP5. The semiconductor photodetector SP10 includes a semiconductor substrate 21, a film 40 containing boron, and an anti-reflection film AR2 (aluminum oxide film). The semiconductor photodetector SP10 is different from the semiconductor photodetector SP5 in that it includes the film 40 and the anti-reflection film AR2.

The film 40 is disposed on the second main surface 21b. The film 40 is in contact with the slope 10a to cover the slope 10a of the protrusion 10, as in the semiconductor photodetector SP9. The thickness of the film 40 is 1 to 30 nm, for example. In the present embodiment, the film 40 is also a film made of boron.

The anti-reflection film AR2 is disposed on the second main surface 1b via the film 40, as in the semiconductor photodetector SP9. The thickness of the anti-reflection film AR2 is 0.01 to 1 μm, for example. In the present embodiment, unlike the semiconductor photodetector SP5, the region in which the plurality of protrusions 10 is formed is exposed from the insulating layer 27. That is, the insulating layer 27 does not cover the region in which the plurality of protrusions 10 is formed. An example of the insulating layer 27 is a silicon oxide ($SiO_2$) film.

The semiconductor photodetector SP10 also achieves enhancement in spectral responses in each of wavelength bands of ultraviolet and near-infrared, similarly to the cases of the semiconductor photodetectors SP1, SP2, SP3, SP4, SP5, SP6, SP7, SP8, and SP9. Since the semiconductor photodetector SP10 includes the anti-reflection film AR2, the spectral responses in the ultraviolet and near-infrared wavelength bands are further enhanced in the semiconductor photodetector SP10 as described above.

In the semiconductor photodetector SP10, as in the semiconductor photodetectors SP7, SP8, and SP9, since the film 40 containing boron is disposed on the second main surface 21b (light incident surface), the spectral response in the ultraviolet wavelength band is suppressed.

Although the embodiments of the present invention have been described above, the present invention is not necessarily limited to the above-described embodiments, and various modifications can be made without departing from the gist thereof.

INDUSTRIAL APPLICABILITY

The present invention is applicable to a semiconductor photodetector including a silicon substrate.

REFERENCE SIGNS LIST 1, 21 Semiconductor substrate
1a, 21a First main surface
1b, 21b Second main surface
3 Semiconductor layer
10 Protrusion
10a Slope
11 Accumulation layer
13 Aluminum oxide film
23 Semiconductor region
27 Insulating layer (silicon oxide film)
40 Film containing boron
AR1 Anti-reflection film (silicon oxide film)
EL Electrode film
L Light
SP1, SP2, SP3, SP4, SP5, SP6, SP7, SP8, SP9, SP10 Semiconductor photodetector.

The invention claimed is:

1. A semiconductor photodetector, comprising a silicon substrate including a light incident surface and a back surface opposing the light incident surface and configured to generate carriers in response to incident light,
wherein a plurality of protrusions including slopes inclined with respect to a thickness direction of the silicon substrate is formed on the light incident surface,
a (111) surface of the silicon substrate is exposed as slope at each protrusion,
a height of each protrusion is equal to or more than 200 nm,
a semiconductor region having a conductivity type different from that of the silicon substrate is provided on the back surface side of the silicon substrate,
an accumulation layer is provided on the light incident surface side of the silicon substrate, and
the slope of each protrusion is included in a surface of the accumulation layer.

2. The semiconductor photodetector according to claim 1, wherein a semiconductor region having a conductivity type different from that of the silicon substrate is provided on the light incident surface side of the silicon substrate.

3. The semiconductor photodetector according to claim 1, further comprising:
an oxide film disposed on the light incident surface and configured to transmit the incident light, and
an electrode film disposed on the oxide film and configured to transmit the incident light and be connected to a predetermined potential.

4. The semiconductor photodetector according to claim 3, wherein the electrode film includes a film made of graphene.

5. The semiconductor photodetector according to claim 3, wherein the oxide film includes a silicon oxide film.

6. The semiconductor photodetector according to claim 3, wherein the oxide film includes an aluminum oxide film.

7. The semiconductor photodetector according to claim 1, further comprising
a film disposed on the light incident surface, configured to transmit the incident light, and containing boron.

8. A semiconductor photodetector, comprising a silicon substrate including a light incident surface and a back surface opposing the light incident surface and configured to generate carriers in response to incident light;
an oxide film disposed on the light incident surface and configured to transmit the incident light; and
an electrode film disposed on the oxide film and configured to transmit the incident light and be connected to a predetermined potential,
wherein a plurality of protrusions including slopes inclined with respect to a thickness direction of the silicon substrate is formed on the light incident surface,
a (111) surface of the silicon substrate is exposed as the slope at each protrusion, and a height of each protrusion is equal to or more than 200 nm.

9. The semiconductor photodetector according to claim 8, wherein a semiconductor region having a conductivity type different from that of the silicon substrate is provided on the light incident surface side of the silicon substrate.

10. The semiconductor photodetector according to claim 8, wherein the electrode film includes a film made of graphene.

11. The semiconductor photodetector according to claim 8, wherein the oxide film includes a silicon oxide film.

12. The semiconductor photodetector according to claim 8, wherein the oxide film includes an aluminum oxide film.

13. The semiconductor photodetector according to claim 8, further comprising
a film disposed on the light incident surface, configured to transmit the incident light, and containing boron.

14. A semiconductor photodetector, comprising a silicon substrate including a light incident surface and a back surface opposing the light incident surface and configured to generate carriers in response to incident light; and
a film disposed on the light incident surface, configured to transmit the incident light, and containing boron,
wherein a plurality of protrusions including slopes inclined with respect to a thickness direction of the silicon substrate is formed on the light incident surface,
a (111) surface of the silicon substrate is exposed as the slope at each protrusion, and
a height of each protrusion is equal to or more than 200 nm.

15. The semiconductor photodetector according to claim 14, wherein a semiconductor region having a conductivity type different from that of the silicon substrate is provided on the light incident surface side of the silicon substrate.

* * * * *